(12) United States Patent
Kellman et al.

(10) Patent No.: US 6,771,067 B2
(45) Date of Patent: Aug. 3, 2004

(54) GHOST ARTIFACT CANCELLATION USING PHASED ARRAY PROCESSING

(75) Inventors: Peter Kellman, Bethesda, MD (US); Elliot McVeigh, Phoenix, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 159 days.

(21) Appl. No.: 09/825,617

(22) Filed: Apr. 3, 2001

(65) Prior Publication Data

US 2002/0167315 A1 Nov. 14, 2002

(51) Int. Cl.[7] .................................................. G01V 3/00
(52) U.S. Cl. ...................................... 324/307; 324/309
(58) Field of Search .............................. 324/307, 309, 324/308, 306, 300, 312, 314

(56) References Cited

U.S. PATENT DOCUMENTS

| | | | |
|---|---|---|---|
| 4,710,717 A | | 12/1987 | Pelc et al. |
| 4,720,678 A | | 1/1988 | Glover et al. |
| 4,937,526 A | | 6/1990 | Ehman et al. |
| 5,138,259 A | | 8/1992 | Schmitt et al. |
| 5,208,534 A | | 5/1993 | Okamoto et al. |
| 5,233,302 A | * | 8/1993 | Xiang et al. ................. 324/309 |
| 5,304,929 A | | 4/1994 | Fang et al. |
| 5,323,110 A | | 6/1994 | Fielden et al. |
| 5,351,305 A | | 9/1994 | Wood et al. |
| 5,431,163 A | | 7/1995 | Kajiyama |
| 5,515,852 A | | 5/1996 | Karp et al. |
| 5,633,585 A | | 5/1997 | Kuhn |
| 5,647,370 A | | 7/1997 | Harnoncourt |
| 5,653,233 A | | 8/1997 | Pelc et al. |
| 5,667,373 A | | 9/1997 | Wright et al. |
| 5,697,370 A | | 12/1997 | Pelc et al. |
| 5,722,409 A | | 3/1998 | Kuhara et al. |
| 5,729,140 A | | 3/1998 | Kruger et al. |
| 6,043,651 A | | 3/2000 | Heid |
| RE36,679 E | | 5/2000 | Zakhor et al. |
| 6,160,398 A | | 12/2000 | Walsh |
| 6,469,506 B1 | * | 10/2002 | Felmlee et al. ............... 324/309 |
| 6,483,308 B1 | * | 11/2002 | Ma et al. ...................... 324/312 |
| 6,556,009 B2 | * | 4/2003 | Kellman et al. ............. 324/309 |

FOREIGN PATENT DOCUMENTS

WO    WO99/54746 A1    10/1999

OTHER PUBLICATIONS

Golay et al., *PRESTO–SENSE: An Ultrafast Whole–Brain fMRI Technique.* Magn Reson Med. Jun. 2000; 43(6): 779–86.

(List continued on next page.)

*Primary Examiner*—Louis M. Arana
(74) *Attorney, Agent, or Firm*—Klarquist Sparkman, LLP

(57) ABSTRACT

A ghost artifact cancellation technique is disclosed. Phased array combining is used to cancel ghosts caused by a variety of distortion mechanisms, including space-variant distortions, such as local flow or off-resonance. The technique uses a constrained optimization that optimizes signal-to-noise ratio (SNR) subject to the constraint of nulling ghost artifacts at known locations. In one aspect multi-coil, k-space data is passed through a converter to convert the k-space data to image domain. After the conversion, the images contain ghost artifacts. The images are then passed through one or more phased array combiners. Each phased array combiner separates the superimposed ghosts to produce an image without ghosts. These images may then be aligned by means of shifting and combined by a variety of means to improve the final image quality. In another aspect, the phase encode order is varied in time to produce ghosts with time varying phase. The series of images are then used to adaptively compute the phased array combiner and output combiner coefficients. The developed technique may be used with phase encode orders which reduce image distortion.

32 Claims, 9 Drawing Sheets

OTHER PUBLICATIONS

Pruessmann et al., *SENSE: Sensitivity Encoding for Fast MRI*. Mag Reson Med. Nov. 1999; 42(5): 952–962.

Madore et al., *Unaliasing by Fourier–Encoding the Overlaps Using the Temporal Dimension [UNFOLD], Applied to Cardiac Imaging and fMRI*. Mag Reson Med. Nov. 1999; 42(5):813–2.

Koestler et al., *Heart Perfusion Imaging Using SENSE*, 2000 Scientific Program, Radiological Society of North America, 85th Scientific Assembly and Annual Meeting, Nov. 26–Dec. 1, 2000, Chicago, Illinois.

S. Kuhara et al., *A Novel EPI Reconstruction Technique using Multiple RF Coiul Sensitivity Maps*.

Walsh, David O., et al., *Adaptive Reconstruction of Phased Array MR Imagery*, Magnetic Resonance in Medicine 43:682–690 (2000).

Xin Wan et al., *Reduction of Geometric and Intensity Distortions in Echo–Planar maging Using a Multireference Scan*, MRM 37:932–944 (1997).

Xin Wan et al., *Reduction of Phase Error Ghosting Artifacts in Thin Slice Fast Spin–Echo Imaging*, MRM 34:632–638 (1995).

Feinberg et al., *Phase Errors in Multi–Shot Echo Planar Imaging*, MRM 32:535–539 (1994).

Wetter et al., *Cardiac Echo–planar MR Imaging: Comparison of Single–and Multiple–shot Techniques*, Department of Radiology, University Hospital Zurich, from the 1994 RSNA Scientific Assembly.

Buonocore et al., *High Spatial Resolution EPI Using an Odd Number of Interleaves*, MRM 41:1199–1205 (1990).

Sodickson, Daniel K., Manning, Warren J., "Simultaneous Acquisition of Spatial Harmonics (SMASH): Fast Imaging with Radiofrequency Coil Arrays", *MRM* 38:591–603 (1997).

Carlson, Blair D., "Covariance Matrix Estimation Errors and Diagonal Loading in Adaptive Arrays", *IEEE Transactions on Aerospace and Electronic Systems*, 1988;24:397–401.

Haykin, Simon, "Adaptive Filter Theory", Third Edition, New Jersey: *Prentice Hall Information and System Sciences Series*.

Heidemann, R., Griswold, M., et al., "Variable Density AUTO–SMASH Imaging", Physikalisches Institut, Würzburg University, Würzburg, Germany.

Epstein, Frederick H., Wolff, Steven D., Arai, Andrew E., "Segmented k–Space Fast Cardiac Imaging Using an Echo–Train Readout", *Magnetic Resonance in Medicine* 41:609–613 (1999).

Kellman, P., McVeigh, E.R., "Method for Combining UNFOLD with SENSE or SMASH", Laboratory for Cardiac Energetics, *National Heart, Lung and Blood Institute, NIH, Bethesda, MD*.

Weiger, Markus et al., "Specific Coil Design for SENSE: A Six–Element Cardiac Array", *Institute of Biomedical Engineering and Medical Informatics, University and ETH*, Zurich, Switzerland.

Kellman, P.,Epstein, McVeigh, Adaptive Sensitivity Encoding Incorporating Temporal Filtering (TSENSE), *Laboratory of Cardiac Energetics, National Institutes of Health, National Heart, Lung and Blood Institute, Bethesda, MD*.

London, J.F., Epstein, F.H., Kellman, P., Wassmuth, R., Arai, A.E., "Exercise Cardiac Stress Testing Using Real–Time MRI", *Scientific Assembly and Annual Meeting, 2000*.

Weiger, M. Pruessmann, K.P., Boesiger, P., "Cardiac Real–Time Imaging Using SENSE", *Magnetic Resonance in Medicine* 43:177–184 (2000).

Sodickson, D., "Tailored SMASH Image Reconstructions for Robust In Vivo Parallel MR Imaging", *Magnetic Resonance in Medicine 44*: 243–251 (2000).

Griswold MA, Jakob PM, Edelman, RR, Sodickson DK. Alternative EPI acquisition strategies using SMASH. *Proc. Intl. Soc. Magn Reson Med* 1998;423.

Farzaneh F, Riederer SJ, Pelc NJ. Analysis of T2 limitations and off–resonance effects on spatial resolution and artifacts in echo–planar imaging. *Magn Reson Med* 1990; 14:123–139.

McKinnon GC, Ultrafast interleaved gradient–echo–planar imaging on a standard scanner, *Magn Reson Med* 1993; 30: 609–616.

Feinberg DA, Oshio K. Phase errors in multi–shot echo planar imaging. *Magn Reson Med* 1994; 32:535–539.

Reeder SB, Atalar E, Bolster BD Jr, McVeigh ER. Quantification and reduction of ghosting artifacts in interleaved echo–planar imaging. *Magn Reson Med* 1997; 38:429–439.

Reeder SB, Atalar E, Faranesh AZ, McVeigh ER. Multi–echo segmented k–space imaging: an optimized hybrid sequence for ultrafastcardiac imaging. *Magn Reson Med* 1999; 4:375–385.

D.H. Johnson, D.E. Dudgeon, Array Signal Processing: Concepts and Techniques, New Jersey:Prentiss–Hall; 1993. pp. 355–371.

A. Oppelt, R. Graumann, H. Barfuβ, H. Fischer, W. Hartl, W. Shajor, FISP—a new fast MRI sequence, *Electromedica*, 1986; 54:15–18.

P.B. Roemer, W.A. Edelstein, C.E. Hayes, S.P. Souza, O.M. Mueller, "The NMR phased array," *Magn Reson Med*, 1990;16:192–225.

Kellman, P. and McVeigh, E., "Ghost Artifact Cancellation Using Phased Array Processing", Magnetic Resonance in Medicine, Academic Press, Duluth, MN, US, vol. 2, No. 46, Aug. 2001 (pp. 335–343).

* cited by examiner

GHOST ARTIFACT CANCELLATION USING PHASED ARRAY PROCESSING

FIELD OF THE INVENTION

The present invention relates generally to magnetic resonance imaging (MRI), and more particularly relates to the cancellation of ghost artifacts in MRI imaging caused by a variety of distortion mechanisms.

BACKGROUND

Magnetic Resonance Imaging is based on the absorption and emission of energy in the radio frequency range. To obtain the necessary MR images, a patient (or other target) is placed in a magnetic resonance scanner. The scanner provides a uniform magnetic field that causes individual magnetic moments of spins in the patient or target to align with the magnetic field. The scanner also includes multiple coils that apply a transverse magnetic field. RF pulses (called "shots") are applied to the coils that cause the aligned moments to be rotated or tipped. In response to the RF pulses, a signal is emitted by the excited spins that is detected by receiver coils.

The resulting data obtained by the receiver coils corresponds to the spatial frequency domain and is called k-space data. The k-space data includes multiple lines called phase encodes or echoes. Each line is digitized by collecting a number of samples (e.g., 128–256). A set of k-space data is acquired for each image frame, and each k-space data set is converted to an image by passing the data through a fast Fourier transform (FFT). FIG. 1A shows an example of a full k-space data set with all of the phase encodes (1, 2, 3 . . . N) acquired.

In several applications of MRI, a time series or sequence of images are obtained in order to resolve temporal variations experienced by the imaged object. For example, in cardiac imaging it is desirable to obtain a sequence of images to study the dynamic aspects of the heart. Unfortunately, image distortion such as ghost artifacts or blurring may interfere with the ability to properly interpret the image. An artifact is a feature that appears in the resultant image even though it is not actually present in the target object. Amplitude and/or phase distortion in the acquired k-space data causes distortion in the resultant reconstructed image. The order of k-space acquisition (phase encode order) is an important factor in determining the type of image distortion. Periodic distortion of k-space data causes periodic ghosts artifacts. A ghost artifact appears as part of the target object shifted an offset amount and superimposed on the final image.

There are a wide variety of mechanisms that cause distortion of the acquired k-space data and that may result in ghost and/or blurring artifacts. If the phase encode order results in distortion that is periodic or has a periodic component, the image will have periodic ghost artifacts. In this context, distortion is described herein as periodic if it has a periodic component (which causes image domain ghosts), even if the distortion is not purely periodic since it may contain other non-periodic components. Examples of distortion mechanisms include off-resonance due to chemical shift or susceptibility variation, flow (e.g., blood flow), motion of the imaged object (e.g., breathing, heart, etc.), EPI delay or phase misalignment, and T2* amplitude decay. Ghosts may also result from periodic undersampling of k-space, which is used in a number of reduced field of view methods for accelerated imaging.

Distortion may be space invariant or space variant. Space invariant distortion refers to the case where each pixel in the image has been affected by the same distortion, while the more general case of space variant distortion refers to the case where the distortion may vary depending on the pixel location. With a space invariant ghost, all pixels in the image have a corresponding ghost with a fixed separation and same relative amplitude. In the case of space variant ghost distortion, the relative amplitude and/or separation of the ghost may depend on the pixel location.

FIG. 2A shows an example of multi-shot echo-planar imaging (EPI) with a non-interleaved phase encode order that cause distortion. The phase encodes are shown indicating the direction of a scan (indicated by arrow), such as shown at 10. As can be seen, the echoes are taken sequentially from each shot (e.g., echo 1, echo 2, echo 3, etc.). In this example, each shot has 4 echoes. Because the echo time (TE) for each echo is different, the amplitude and phase are different for each echo, which creates a distortion of the k-space data. Consequently, this non-interleaved ordering causes periodic distortion of the k-space data, which causes periodic ghosts in the resultant reconstructed image. For this reason, multi-shot non-interleaved phase encode ordering is not typically used to avoid ghost artifacts.

In this multi-shot EPI example, many prior art techniques eliminate the ghosts by acquiring the k-space data using an interleaved phase encode order to ensure that the distortion is not periodic and is a slowly varying function of k-space. Furthermore, a technique known as echo-shifting is also used to linearize the echo time (TE) versus phase encode number (ky) which also reduces blur distortion at the cost of increased overall acquisition time.

FIG. 2B shows an example of an interleaved phase encode order. In the illustrated example, each shot has four echoes. The line of k-space are acquired in an interleaved manner such that groups of adjacent lines in k-space are acquired at the same echo time (TE). For example, the first echoes from each shot are grouped together, as shown at 12. Likewise, all of the echos from the second shot are grouped together, as shown at 14. Grouping together similar echoes in this interleaved manner eliminates the rapid variation of echo time versus k-space, and, therefore, eliminates widely spaced ghost artifacts in favor of a more subtle blurring and/or geometric distortion.

Echo-planar imaging (EPI) is used in many MR rapid imaging applications and ghost reduction for EPI has received considerable attention. Many techniques on the prior art are based on compensating (equalizing) periodic k-space distortion. These methods first estimate the periodic phase (or other) distortion, and then apply compensating phase function to eliminate or reduce the distortions. Numerous schemes have been developed for estimating the phase errors. However, these methods only cope with the case of space invariant distortion, therefore, residual distortion will remain, due to a number of space variant mechanisms that cannot be compensated for in this manner. Ghost artifacts due to local effects such as flow and off-resonance are space variant and are not mitigated by k-space phase compensation methods.

Methods have been developed which address certain cases of space variant distortion, such as local off-resonance effects. These rely on estimating the space variant distortion by means of a measurement of the field map, followed by applying the inverse to remove the space variant distortion. It is difficult to obtain accurate field maps, particularly in cases where the susceptibility (field) is time varying, such as in cardiac imaging applications. These methods are often quite sensitive to error cause by noise.

Phase array combining methods have been used for accelerated imaging (e.g., methods known as SENSE and SMASH) to cancel space invariant ghosts that arise from periodic undersampling. SMASH has also been applied to more general EPI ghost cancellation but still only handles space invariant distortion. An example of a technique using the SENSE method applied to single shot EPI ghost cancellation is shown in Kuhara et al., *A Novel EPI Reconstruction Technique using Multiple RF Coil Sensitivity Maps*. This application acquired multi-coil full field-of-view (FOV) k-space data and separates the k-space data into even and odd lines. The even lines are passed through a first fast Fourier transform image reconstruction component, while the odd lines are passed through a second fast Fourier transform component. The even and odd lines are separately processed using the SENSE method. The outputs of each of the separate SENSE reconstructions are then non-coherently combined to obtain the final image with ghost artifacts cancelled. In this latter method, magnitude combining was used which precluded this method to be used in conjunction with techniques which required preserving phase, such as phase contrast or partial-Fourier acquisition.

SUMMARY

The present invention uses phased array combining to cancel ghosts by a variety of distortion mechanisms, including space-variant distortions, such as local flow or off-resonance. The method uses a constrained optimization that optimizes signal-to-noise ratio (SNR) subject to the constraint of nulling ghost artifacts at known locations. The method may be applied to cancel ghost artifacts that result from a variety of phase encode strategies, for example, multi-shot EPI with non-interleaved phase encode acquisition. The overall strategy of using phase encode acquisition orders with distortion that results in ghosts, followed by applying this phased array ghost cancellation method has a number of benefits, including reduced blur and geometric distortion, reduced acquisition time (eliminating echo shifting), and reduced sensitivity to flow. This method may be used in conjunction with phase sensitive techniques.

In one aspect multi-coil, full field-of-view k-space data is passed through a converter (or image reconstructer) to convert the k-space data to image domain. After the conversion, the images contain ghost artifacts. The images are then passed through one or more phased array combiners. The phased array combiners act to separate the superimposed images (desired and ghosts). Each phased array combiner in conjunction with shifting the input image produces an image or ghost with the other ghost images cancelled. Alternatively, the phased array combiner coefficients may be shifted rather than the input images to similarly separate the superimposed images. The outputs of the phased array combiners each represent images without ghost distortion. Each output image may have a different amplitude or complex weighting, where the weighting function may vary pixel to pixel in the image. One or more individual images (ghosts) may be combined to produce a final image with ghost artifacts cancelled. In one method, the individual images may be combined non-coherently to produce a magnitude image. In an alternative embodiment, the outputs may be coherently combined by means of complex weightings to produce a complex image, which may either be magnitude detected or used in conjunction with other techniques which require a complex image.

In another aspect, the phased array combiners coefficients used to cancel ghost artifacts can be calculated adaptively or dynamically. There are a number of ways to perform the adaptive calculation of the phased array combiner coefficients. One technique is to reconstruct an artifact-free lower temporal resolution image from a time sequence of multi-coil, k-space data in which the phase encode order is time varying in a specific fashion. The reconstructed artifact free image is then used to calculate the phased array coefficients that are applied to the phased array combiners.

In yet another aspect, the output combiner coefficients may be calculated adaptively to produce the final sequence of images with ghost artifacts cancelled.

The invention provides a number of benefits including reduced distortion due to off-resonance, in-plane flow, and EPI delay misalignment, and the elimination of the need for echo-shifting.

Further features and advantages of the invention will become apparent with reference to the following detailed description and accompanying drawings.

DETAILED DESCRIPTION

Overview of System

Figure 1:
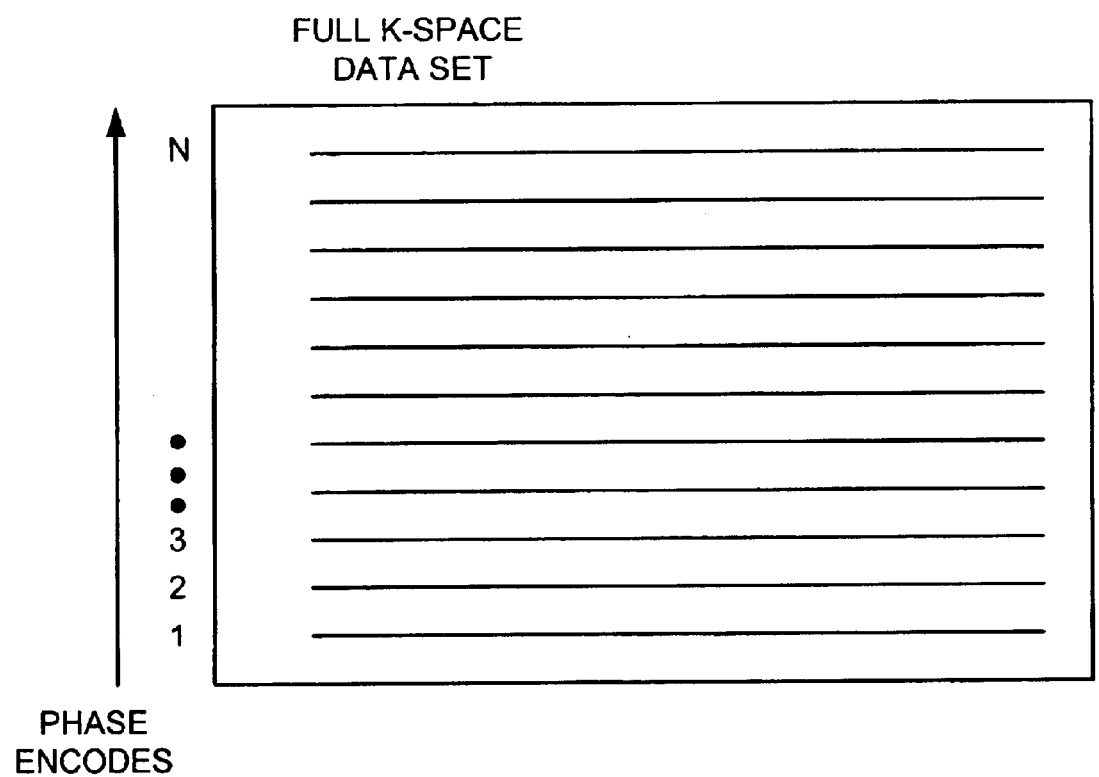
FIG. 1 is an example of a k-space data set with all phase encodes acquired.
Figure 2A:
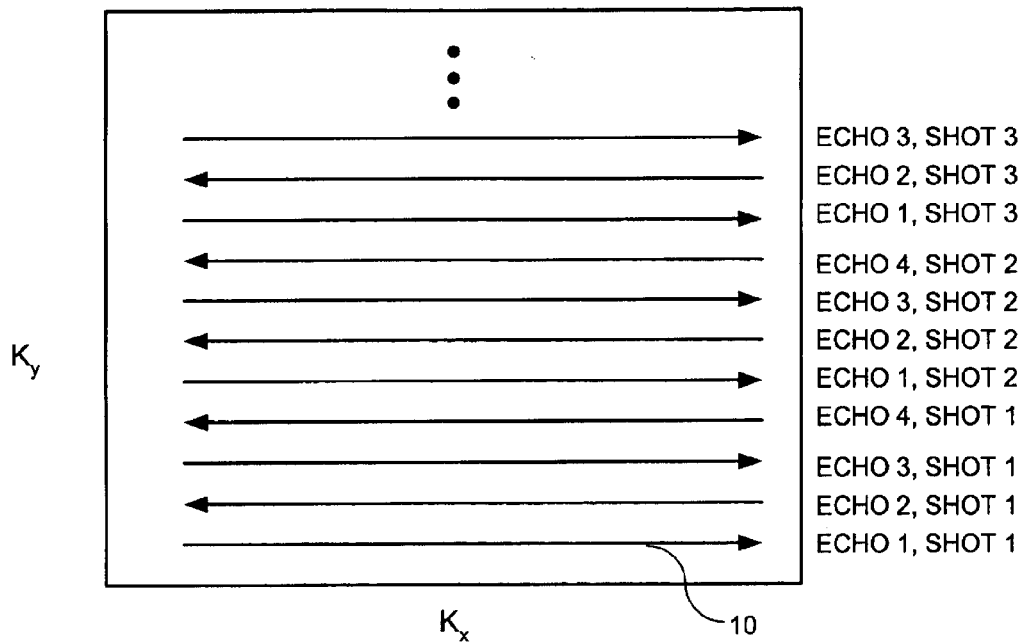
FIG. 2A is an example of a k-space data set with the phase encodes acquired using multiple shots with a non-interleaved order.
Figure 2B:
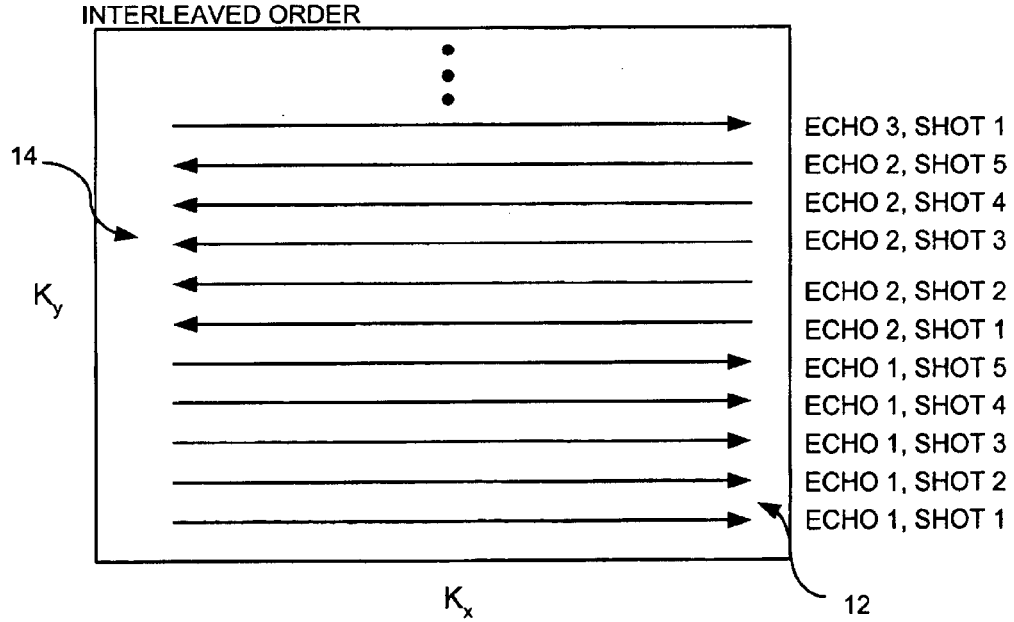
FIG. 2B is an example of a k-space data set with the phase encodes acquired using multiple shots with an interleaved order.
Figure 3:
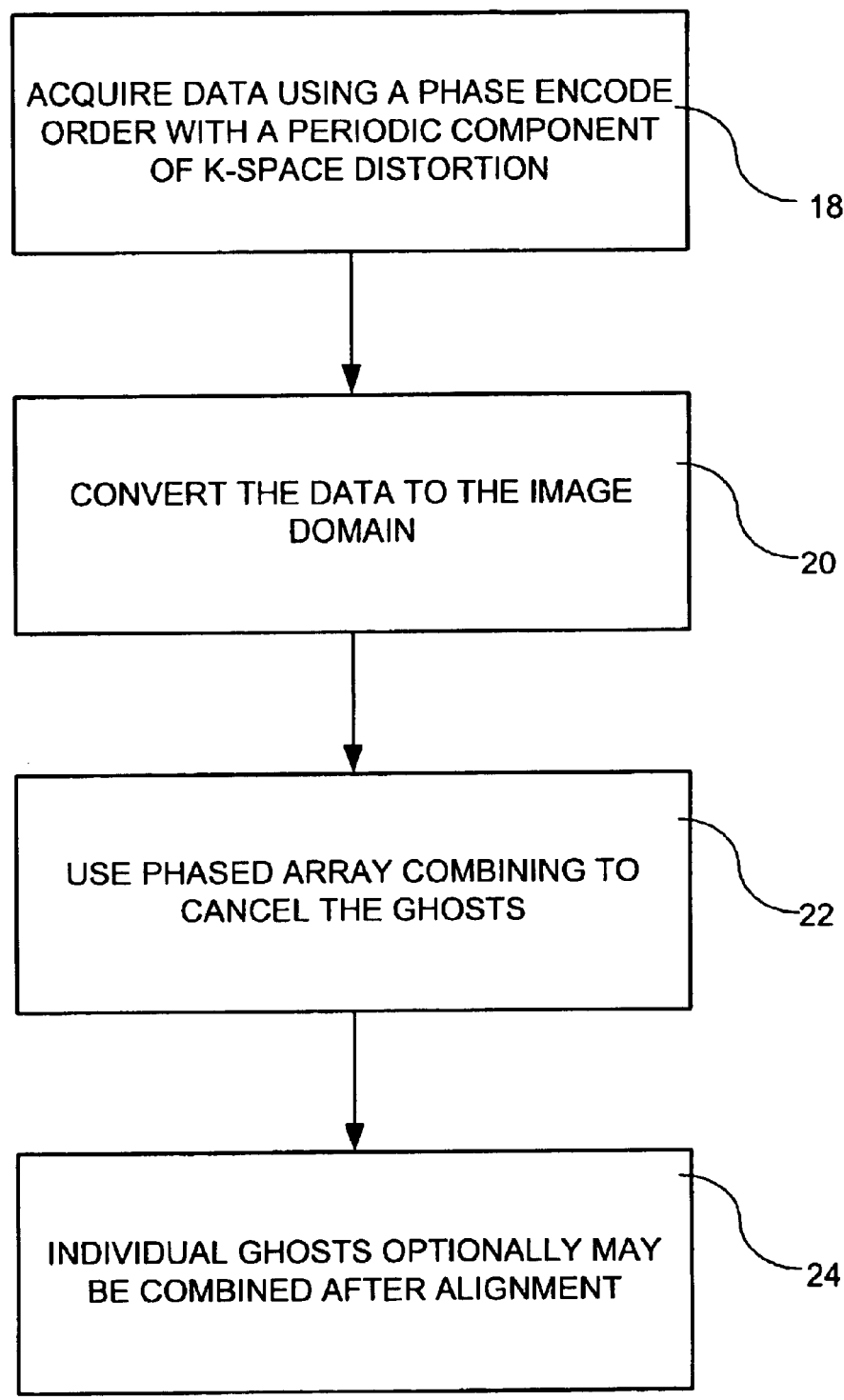
FIG. 3 is a flowchart of a method for canceling ghost artifacts in accordance with one embodiment of the invention.

FIG. 3 shows a flowchart of a method for canceling ghost artifacts. In a first process block 18, multi-coil k-space data is acquired one line at a time with a prescribed phase encode order which leads to distortion which is periodic in k-space. The k-space data is then converted to the image domain (process block 20) using a fast Fourier transform or some other conversion technique well understood in the art. The substantially periodic k-space distortion leads to ghost artifacts in the reconstructed images. In this context, substantially periodic means that the distortion is periodic or has a periodic component even if the distortion is not purely periodic since it may contain other non-periodic components. The ghost images are separated (process block 22) using phased array combining to null or cancel the superimposed images. The individual ghost images may be combined (process block 24) after alignment (shift of images) to further improve the signal-to-noise ratio (SNR).

The number of coils should be greater than or equal to the number of superimposed images (desired image plus ghosts) to be cancelled. The performance of this method will depend on the number and spacing of ghosts, as well as the number of coils and the coils sensitivity profiles. In general, the performance is improved as the ghost spacing increases. The method may be applied in situations for which the k-space acquisition order has substantially periodic k-space distortion, which results in image domain ghost artifacts. A number of benefits accrue by adopting a strategy which uses a phase encode order makes the distortion periodic and uses phased array processing to cancel the resultant ghost artifacts. These benefits include reduced distortion due to off-resonance, flow, and EPI delay misalignment, as well as eliminating the need for echo-shifting.

EXAMPLE EMBODIMENTS USING PHASED ARRAY PROCESSING

Figure 4:
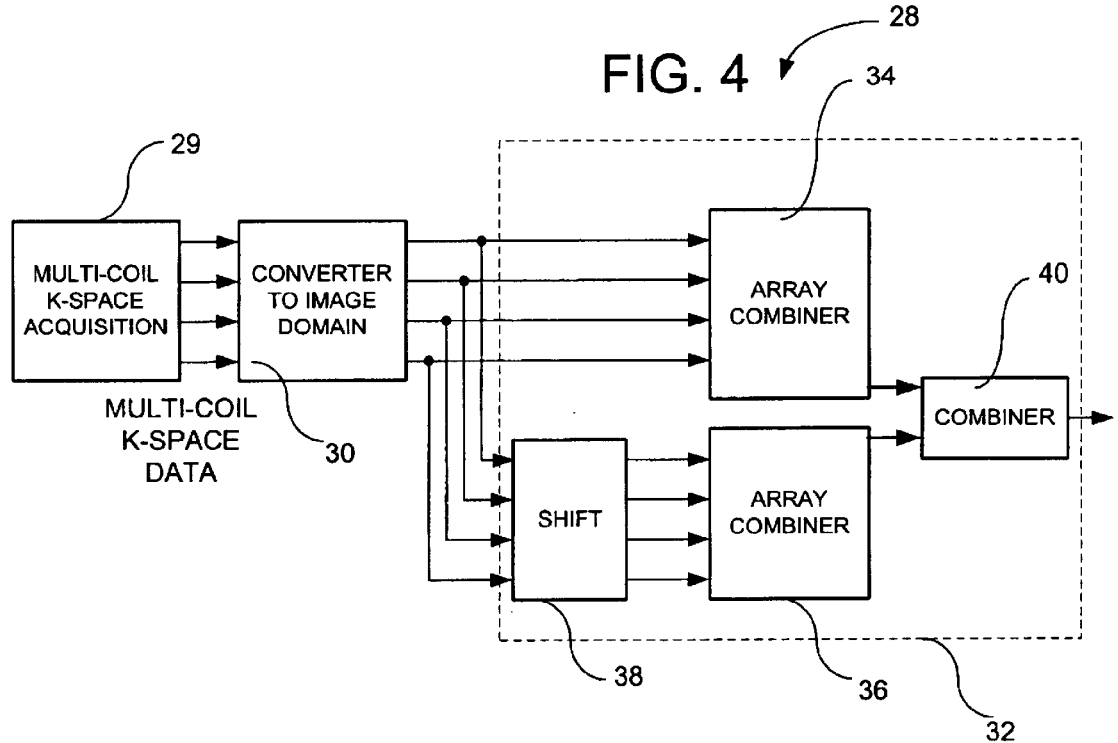
FIG. 4 shows another embodiment of the invention for canceling a single ghost artifact wherein the superimposed desired and ghost images are separated by means of phased array combining method and recombined after appropriate position alignment (shift).

FIG. 4 shows a block diagram of a system 28 for canceling a single ghost image using phased array processing. For a single ghost, the ghost separation is typically FOV/2. The system 28 includes multi-coil k-space acquisition 29, a converter 30, and a phased array ghost cancellation processor 32. The phased array ghost cancellation processor 32 includes multiple phased array combiners 34, 36, a shifter 38, and an output image combiner 40. In the specific embodiment of FIG. 4, the system 28 is designed to receive k-space data from four coils positioned around the target to be imaged (as shown by the four lines entering the converter 30). However, the system 28 can readily be expanded to handle any desired number of coils at various positions.

The converter 30 performs image reconstruction to convert data from the spatial spectral domain (k-space) into image domain data. The most common technique for image reconstruction is using a fast Fourier transform (FFT). However, other techniques may be used for image reconstruction as is well understood in the art.

The phased array combiners 34, 36, receive image data associated with each coil and combine the individual coil images to provide a single output image. To combine the images, each phased array combiner performs a complex weighted sum on a pixel-by-pixel basis of image data associated with the multiple coils. The superimposed images are separated by the phased array combiners, with phased array combiner 34 producing the desired image and phased array combiner 36 producing the ghost which has been aligned with the desired image by shifting the image by shift element 38.

The output combiner 40 is coupled to each of the phased array combiners and receives images from each array combiner 34, 36 and combines the images into a final image. The output combiner 40 can take a variety of forms. For example, the combiner 40 can be a magnitude combiner, also called a non-coherent combiner. The combiner 40 can also be a coherent combiner that combines a weighted complex sum on a pixel-by-pixel basis. Coherent combining is sometimes preferable because the phase is included in the final image, although the complex waiting makes the combiner more complicated. The combiner 40 combines the desired image from the phased array combiner 34 with the ghost image from phased array combiner 36 to produce a final image with ghost artifact removed.

In the embodiment of FIG. 4, there is only a single ghost artifact (that is for example, FOV/2 away). Thus, the shift performs a circular shift in the vertical direction of FOV/2. By shifting the image, the array combiner 36 produces an image that is in alignment with the desired image. As explained further below, where multiple ghost artifacts are included in the image data, additional shifts and array combiners may be used. In alternative embodiments the order of phased array combining and image alignment (shifting) may be reversed. However in this case, the phase array combiner coefficients must be properly aligned to cancel the ghost. It should be noted that the individual separated ghosts are weighted depending on the "point spread value" associated with the particular distortion for that pixel. In some cases the ghost image may be considerably weaker intensity than the desired image component or may contain higher intensities in pixels which are predominantly fat and possibly not of interest. In this case, it might be desirable to use the image produced by phased array combiner 34 exclusively. In this situation it is not necessary to use phased array combiner 36 or output image combiner 40. Of course, this can be seen as a special case of the phased array ghost cancellation processor 32.

Figure 8:
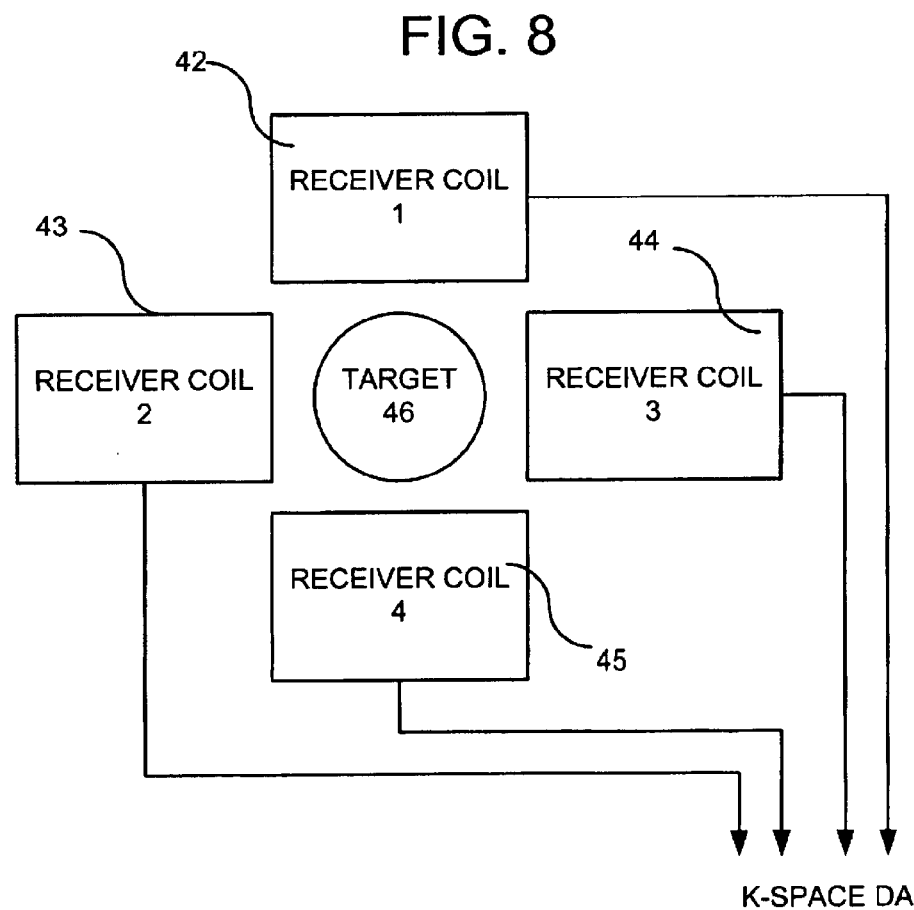
FIG. 8 is a block diagram illustrating a parallel acquisition of k-space data using multiple receiver coils.

Turning briefly to FIG. 8, the k-space data is acquired in parallel from multiple receiver coils 42–45 (sometimes called a phased array of coils) placed around the imaged object 46. The number and spatial location of receiver coils varies based on the particular application. The k-space data is acquired in parallel and is input to the different embodiments shown herein.

Figure 5:
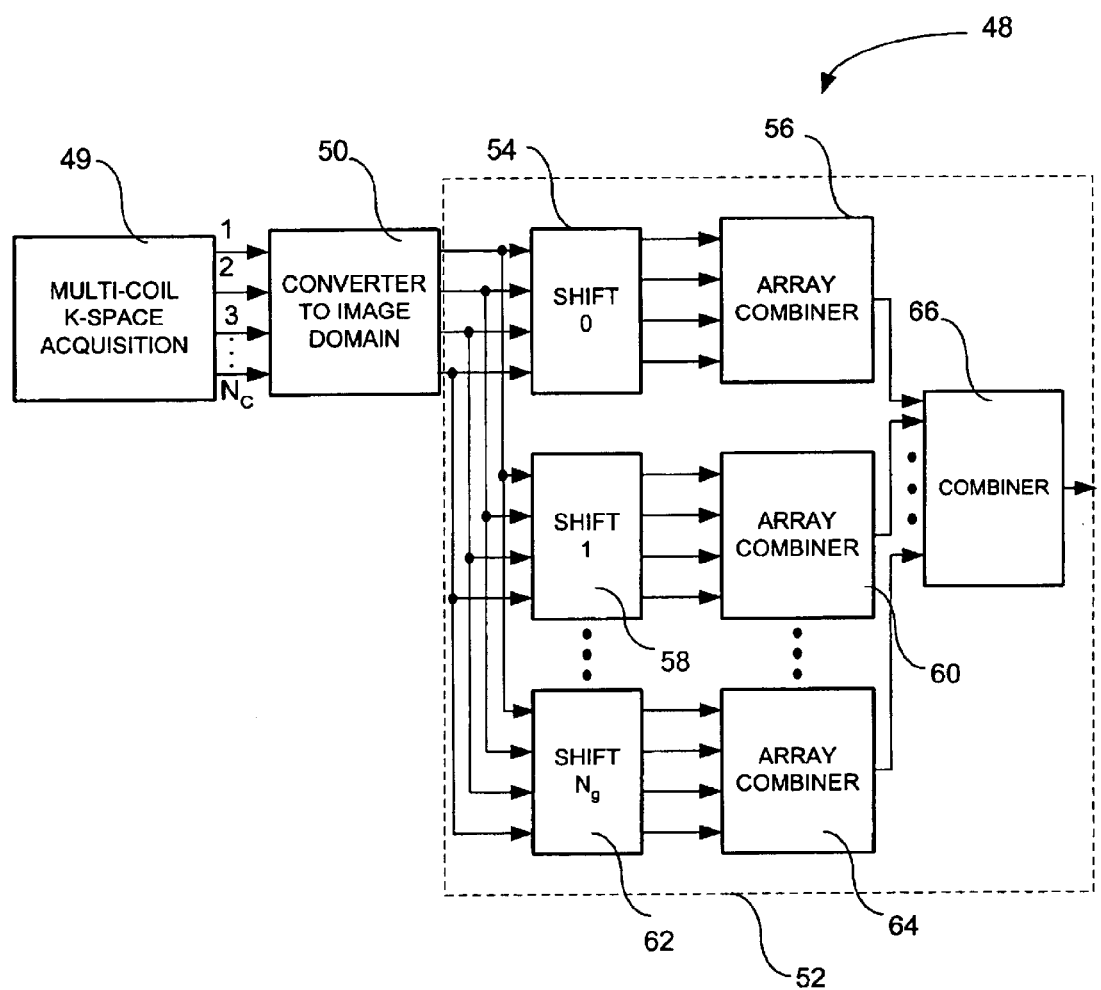
FIG. 5 shows a more generic embodiment of the invention wherein any number of ghost artifacts can be effectively cancelled using phased array processing.

FIG. 5 shows a generic block diagram of a system 48 for canceling ghost artifacts. As in FIG. 4, the system 48 is shown having Nc input coils. The embodiment of FIG. 5 includes multi-coil k-space acquisition 49, a converter 50 and a phased array ghost cancellation processor 52. The phased array ghost cancellation processor 52 includes multiple combinations of shifters and phased array combiners coupled in series. For example, a shifter 54 is coupled in series with a phased array combiner 56. Additionally, a shifter 58 is coupled in series with a phased array combiner 60 and shifter 62 is coupled in series with phased array combiner 64. These shifter/array combiner blocks are coupled in parallel to an output image combiner 66. As indicated in FIG. 5, multiple shifter/combiner blocks may be coupled in parallel. In the system 48, the number of phased array combiners corresponds to the number of superimposed images that must be separated. In FIG. 5, the number of superimposed images equals Ng+1, and this number should be less than or equal to the number of coils Nc in order to cancel the ghosts images. The ghosts are typically spaced uniformly across the field-of-view (FOV), thus the amount each shifter must shift the image corresponds to FOV/(Ng+1) such that all ghost images are properly aligned. For example, for three superimposed images (desired plus 2 ghosts) in an input image, there are three shifters, denoted by shifter 0, shifter 1, and shifter 2. Shifter 0 is only shown for illustration, as it does not actually perform a shift. Shifter 1 shifts the image by one third, and shifter 2 shifts the image by two thirds of the field of view. Array combiner 56 receives images associated with each coil and produces a single image with the desired target object centered in the image. The other array combiners receive images associated with each coil and produce a single image with their respective ghost artifact also centered in the image. Although not shown, the output of the array combiners 56, 60, and 64, may be described mathematically as complex weighted versions $h_0(x,y)f(x,y)$, $h_1(x,y)f(x,y)$, and $h_2(x,y)f$ (x,y) of the desired image f(x,y), where complex weightings $h_0(x,y)$, $h_1(x,y)$, and $h_2(x,y)$ are also referred to as the space variant "point spread function". The output combiner 66 then combines the outputs of the phased array combiners to produce an output image with ghost artifacts removed.

If a particular ghost or ghosts are weak, it may desirable to eliminate these ghosts from the output by not computing these images. It may also be the case that the i-th ghost may not be of interest if the point spread value $h_i(x,y)$ corresponds to a particular chemical shift that may not be of interest. It is also clear that while ghosts are frequently spaced uniformly across the FOV, this technique is entirely general, and may cancel ghosts at know fixed spacings, $D_i$, with the proviso that the ghost cancellation performance depends on the ghost spacing as well as coil sensitivity profiles.

Adaptive Calculation of Phased Array Combiner Coefficients

Figure 6:
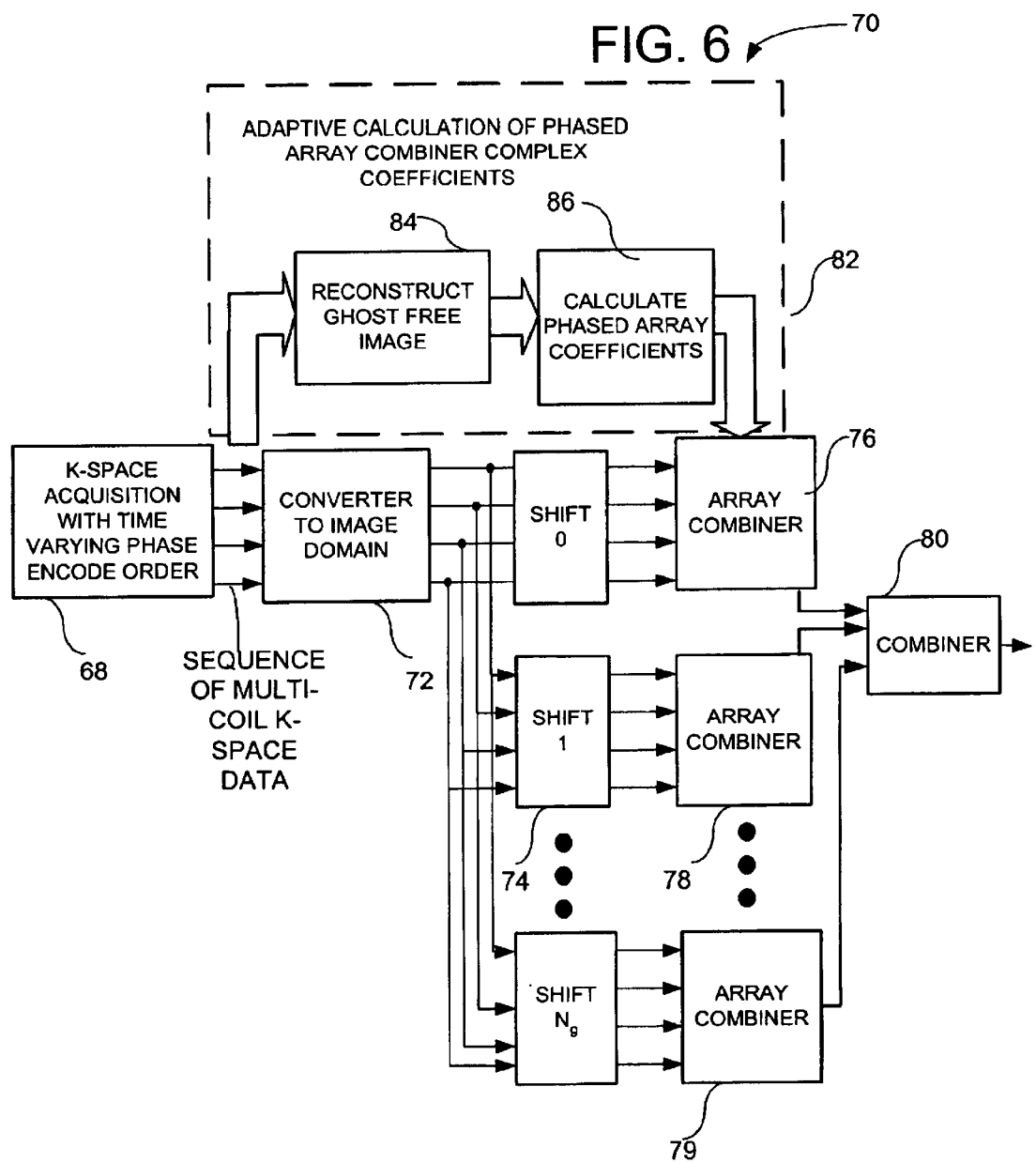
FIG. 6 shows a block diagram for adaptively calculating array coefficients for the array combiner.

FIG. 6 shows another embodiment of a system 70 that includes a converter 72, a shifter 74, phased array combiners 76, 78, and a final output combiner 80. These components are similar to those already described in relation to FIG. 5. FIG. 6 also includes an additional block 82 used for the adaptive calculation of complex coefficients that are applied to all of the phased array combiners 76, 78, 79 (as depicted by the wide arrow from block 86 to block 76) and a time varying k-space data acquisition block 68, which is similar to the k-space acquisition used in the diagram of FIG. 6, except the phase encode order is varied periodically in time in a prescribed fashion. In this context, the term adaptive calculation means to calculate the coefficients from the same k-space data used to reconstruct the desired images, without requiring additional reference data. To adaptively calculate the complex coefficients, the multi-coil, k-space data for a time series of k-space data acquisitions is applied to process block 84 that is used to reconstruct a substantially ghost-free image. The ghost free image is calculated from a set of k-space data acquisitions, corresponding to a time series of images, and thus has lower time resolution, and in some instances may be temporally filtered or smeared. As in the prior method described in FIG. 5, the phase encode order (for each acquisition) is designed so that the distortion is periodic in k-space which results in ghost images. The phase encode order for each acquisition is varied (for example using a shift) such that the distortion remains periodic with the same period, and, furthermore, after a number of acquisitions the complete set of k-space data has been acquired at each echo time. Ghost free estimates, albeit with lower temporal resolution, may be reconstructed by using a set of k-space data (taken from the time series acquisitions) which corresponds to a single echo time. Several such ghost free images may be calculated, one for each echo time in the echo train. An alternative description and method is realized by observing that the variation (for example shift) in phase encode order imparts a variable phase shift to individual ghosts. This phase shift is time varying cyclically. By reconstructing images for each acquisition, the ghosts in each image may be suppressed by means of averaging over a complete cycle (or greater). This is equivalent to summing the individual ghost free images for each echo time derived in the previously described manner. There are numerous time varing phase encode orders 68 and methods for reconstructing the data 84 to obtain a ghost suppressed reference image for calculating the phased array combiner coefficients. In general, the ghost free images calculated by different methods have different complex weightings. A method will be described next which uses multiple combinations to estimate the space variant complex "point spread values" which may be used for output combining.

After reconstruction of a ghost free image, the phased array combiner coefficients are calculated (process block 86). The dynamically calculated coefficients are then passed to the phased array combiners 76, 78, 79 which are also simultaneously receiving sequential image data passed from the converter 72, through their respective shifters. Thus, while the output combiner 80 is providing an output sequence of images, the phased array combiner coefficients are being adaptively calculated and provided to the array combiners 76, 78, 79.

Figure 7:
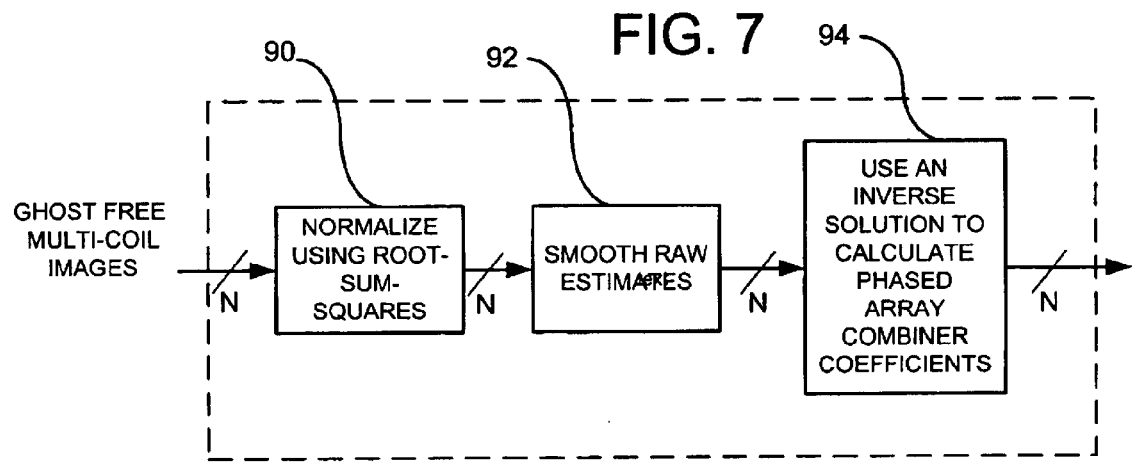
FIG. 7 is a detailed block diagram further illustrating one technique for computing the coefficients of FIG. 5.

FIG. 7 shows a diagram further elaborating on one way in which the phased array combiner coefficients can be calculated. There are numerous ways to compute the phased array combiner coefficients and FIG. 7 shows an example of only one such technique. After receiving the image data from process block 84, the data is normalized using the root sum of squares image to obtain a raw complex sensitivity map (process block 90). The maps may then be spatially smoothed to further enhance the sensitivity maps if required (process block 92). Finally, a general inverse solution is used to calculate the phased array combiner coefficients (process block 94) which will combine the individual coil images in order to null the ghosts.

Adaptive Calculation of Output Combiner Coefficients

Figure 9A:
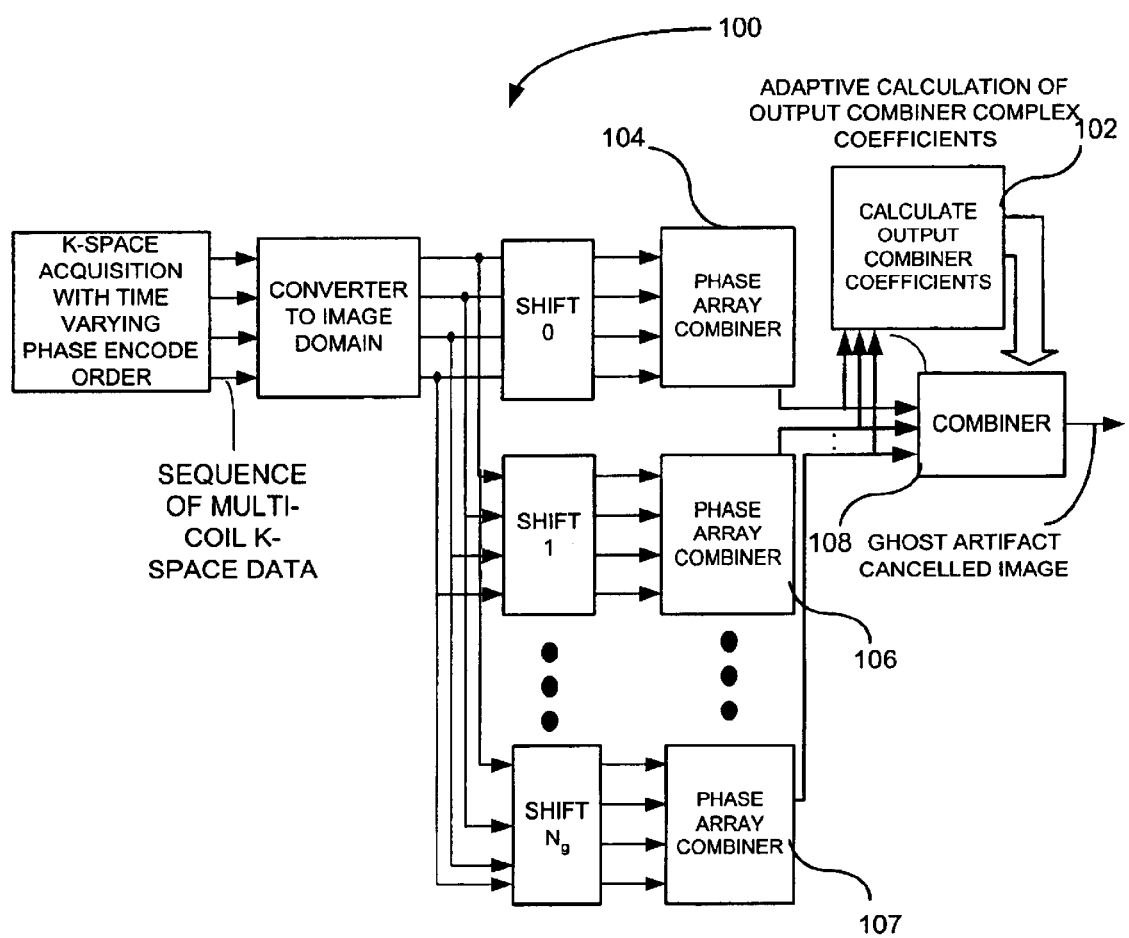
FIG. 9A shows a block diagram for adaptively calculating array coefficients for the final output combiner.

FIG. 9A shows another embodiment of a system 100 that is similar to the systems previously described. An additional process block 102 is added to calculate the output combiner coefficients adaptively. The process block 102 calculates the complex output combiner coefficients from a set of point spread weighted images, which correspond to the set of component (ghosts) of the superimposed image after separation. This set of component images may be calculated by a variety of means. In the method depicted in FIG. 9A, the component images are produced directly by the phased array combiners. Each phased array combiner produces a ghost suppressed image weighted by the complex point spread value for the particular ghost component. In this method, the output of the phased array combiners 104, 106, 107 are fed to output combiner 108. In parallel, the output of the phased array combiners is fed to the process block 102 where the coefficients are calculated in parallel with an output combiner 108 combining the images from the phased array combiners. There are numerous ways to calculate the coefficients for the combiner 102 as further described below.

Figure 9B:
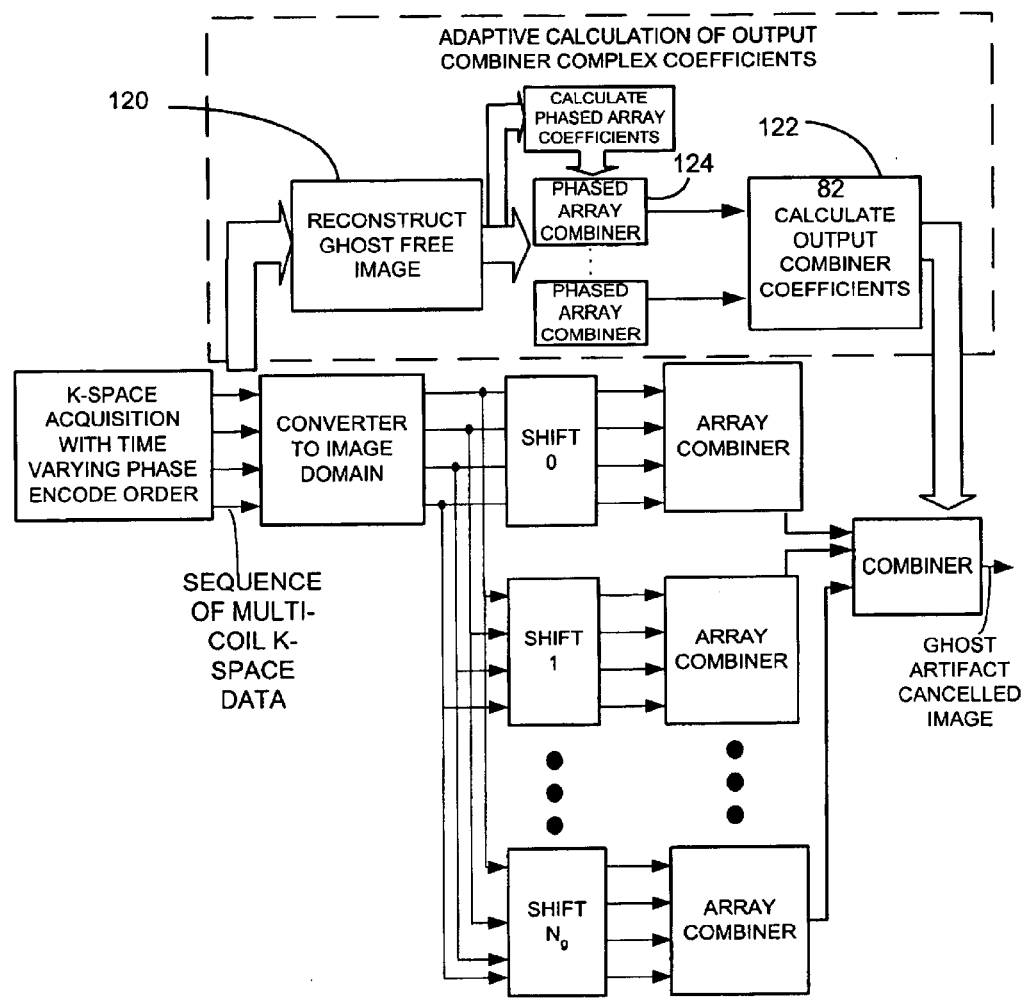
FIG. 9B shows another block diagram for adaptively calculating array coefficients for the final output combiner.

In an alternative method depicted in FIG. 9B, the component images may be calculated by a method similar to that described for calculating the ghost free image used in determining the adaptive phased array combiner coefficients 84 (FIG. 6). This method may be generalized, as will be described, to obtain a set of ghost free images, each weighted by a different value of point spread function. The artifact free image reconstruction block 120 of FIG. 9B may be used to produce images corresponding to any or all of the components (ghosts) of the superimposed image. This is may be accomplished by summing the images with appropriate cyclical phase shift which corresponds to the conjugate of the cyclical phase shift imparted to that particular ghost as a result of the periodic time varying phase encode order. It may also be accomplished by calculating images for k-space data at each echo time (TE) and applying a FFT to this set of images (FFT computed for each pixel along TE dimension). The above two methods produce a set of component images that are multi-coil which should be coherently combined with an additional phased array combiner 124 prior to the block 122 which computes the output combiner coefficients. This phased array combiner 124 differs from the phased array combiners 56, 60, 64 which are used to null ghosts. The phased array combiner 124, is used to combine complex multi-coil images into a single complex image based on optimizing SNR without nulling constraints. The coefficients for this phased array combiner may in turn be calculated adaptively from a series of one of the ghost free reference images. In this case, the inverse solution (block 94 of FIG. 7) is not required. The phased array combiner is simply the complex conjugate of the complex smoothed coil sensitivity profile estimates.

The output combiner coefficients may be calculated, block 122, by a variety of methods. One method to calculate the coefficients is to form the time averaged (or temporally low-pass filtered) sample covariance matrix for each pixel. The coefficients may then be calculated as the dominant eigenvector of the sample covariance matrix (i.e., eigenvector with maximum eigenvalue). In this way, the relative phase between components is preserved.

Temporal Filtering

A periodic time varying phase encode order may be used to acquire k-space data in order to adaptively compute the phased array combiner coefficients. In this case, the phase of each ghost is cyclically time varying, thus each ghost is temporally frequency shifted. Various methods may be used to obtain a ghost suppressed lower time resolution image for computing the adaptive phased array combiner coefficients. It is also possible to apply a temporal filter to the sequence of images in order to provide further ghost suppression. The temporal filter bandwidth may be relatively wide such that there is only a small loss in effective temporal resolution. This filter may be applied in any order prior to magnitude detection. In other words, the multi-coil k-space data may be temporally filtered, or the multi-coil image data may be temporally filtered, or the phase array combined data may be temporally filterered, or the complex output combined data may be temporally filtered. The temporal filter may be as simple as a lowpass filter which suppresses the ghost which is shifted to the bandedge. In this case the filter might have a bandwidth on the order of 80–90% of the full available bandwidth, and will suppress most of the relatively static component of a single ghost. The filter might resemble a comb notch filter that rejects several ghosts. The temporal filter can be used in conjunction with the phased array processing, or even without any phased array processing provided there is time varying phase encode ordering in the correct fashion.

Detailed Theory

Consider the case of ghost artifacts occurring in the phase encode dimension. The reconstructed image, $g_i(x,y)$, for the i-th coil may be written as:

$$g_i(x, y) = \sum_{k=0}^{N_g} s_i(x, y, -kD) h_k(x, y-kD) f(x, y-kD) + n_i(x, y) \quad [1]$$

where $f(x,y)$ is the desired (magnetization) image, $s_i(x,y)$ is the complex field sensitivity for the i-th coil, $N_g$ is the number of ghosts ($N_g+1$ superimposed images) with spacing D, $h_k(x,y)$ is the complex weight of the k-th ghost arising from the signal at $(x,y)$, $n_i(x,y)$ is the observation noise, and $(x,y)$ variables are assumed to be discrete as a result of image reconstruction from a finite set of periodic k-space samples. As a result of periodic k-space sampling with spacing $\Delta k_y$ between phase encode lines, $f(x,y)=f(x,y-FOV_y)$, where $FOV_y=1/\Delta k_y$ is the full field-of-view in the phase encode direction. Equation [1] may be used to model a wide range of ghost mechanisms caused by k-space weightings and space variant distortion due to flow or local off-resonance from chemical shift or field inhomogeneity. As described herein, $h_k$ refers to a "point spread function" (PSF), even though it is understood that it is a function of $(x,y)$ and, therefore, is actually space variant. For reception with $N_c$ coils, Eq. [1] may be written in matrix form as:

$$\begin{bmatrix} g_1(x, y) \\ \vdots \\ g_{N_c}(x, y) \end{bmatrix} = \begin{bmatrix} s_1(x, y) & \cdots & s_1(x, y-N_g D) \\ \vdots & & \vdots \\ s_{N_c}(x, y) & \cdots & s_{N_c}(x, y-N_g D) \end{bmatrix} \quad [2]$$

$$\begin{bmatrix} h_0(x, y) f(x, y) \\ \vdots \\ h_{N_g}(x, y-N_g D) f(x, y-N_g D) \end{bmatrix} + \begin{bmatrix} n_1(x, y) \\ \vdots \\ n_{N_c}(x, y) \end{bmatrix},$$

or more compactly as:

$$g(x,y)=S(x,y)f(x,y)+n(x,y), \quad [3]$$

where the matrix and vectors in Eq. [3] are in direct correspondence with Eq. [2].

Equation [3] becomes over-determined (more equations than unknowns) when the number of coils, $N_c$, is greater than the number of superimposed signals, $N_g+1$, and can be "solved" in the least squares sense for an estimate of $\hat{f}(x,y)$, given estimates for the complex coils sensitivities (B1 maps) $s_i(x,y)$, as well as knowledge of the number of ghosts $N_g$ and spacing D. The weighted least squares estimate $\hat{f}(x,y)$ of $f(x,y)$, which optimizes SNR, may be written as:

$$\hat{f}(x,y)=[S(x,y)^H R_n^{-1} S(x,y)]^{-1} S(x,y)^H R_n^{-1} g(x,y)=U(x,y)g(x,y) \quad [4]$$

where $R_n$ is the noise covariance matrix, the superscript $^H$ denotes the conjugate transpose or Hermitian operator, and the "unmixing" matrix U defined by this equation is $N_g+1$ rows by $N_c$ columns. The k-th component of the vector $\hat{f}(x,y)$ is an estimate of $h_k(x,y-kD)f(x,y-kD)$, a weighted and shifted version of the image $f(x,y)$. Define the vector $\hat{f}(x,y)$ of estimates with all the components properly y-aligned:

$$\hat{f}(x, y) = \begin{bmatrix} h_0(x, y) f(x, y) \\ \vdots \\ h_{N_g}(x, y) f(x, y) \end{bmatrix} + n'(x, y), \quad [5]$$

where $n'(x,y)$ represents the noise after array processing, and perfect artifact cancellation is assumed (i.e., $U(x,y) \cdot S(x,y)$ equals the identity matrix). The individual component ghost images of $\hat{f}(x,y)$ may be combined to gain an improved estimate of the desired image $f(x,y)$. It is not necessary to know the space variant "point spread function" $h_k(x,y)$ in order to cancel the ghosts. However, estimates of the complex PSF may be used to optimize SNR when combining the individual estimates as is described below.

Note that the $(N_g+1) \times N_c$ unmixing matrix U may either be applied to the $N_c \times 1$ image vector g explicitly, as formulated, and then each component image of $\hat{f}$ is $(x,y)$ aligned to create the $N_g \times 1$ image vector $\hat{f}$, or alternatively, as shown in the implementation of FIG. 4 and FIG. 5, the shifting of components is performed prior to array combining. In this case, shown by re-writing Eq. [1] for $g_i(x,y-kD)$, the array combiner weights (for all components) are the simply the first row of the matrix U.

The individual component ghost images, weighted by complex PSF values $h_k(x,y)$, may be combined either coherently or non-coherently. In this context, coherent combining refers to the complex weighted sum which preserves phase, while non-coherent combining refers to the (positive real) weighted sum of magnitudes or root sum of weighted squared magnitudes. For applications that require phase sensitive detection it is desirable to combine coherently in order to preserve the phase. Likewise, in order to perform partial-Fourier acquisition such as partial-NEX, it is necessary to perform the homodyne reconstruction prior to magnitude detection. In this case, coherent combining is desirable to gain improved estimate of background phase prior to homodyne detection.

In applications such as real-time or retrospective cine imaging, for which a series of image frames are acquired, it is possible to use multiple image frames to estimate smoothed matched filter coefficients directly from the series of point spread weighted images, provided that any temporal variation in point spread values is slow relative to the amount of temporal smoothing. One such method for estimating the matched filter coefficients is described below.

This formulation may be recognized as a generalized form of the SENSE method for reduced FOV imaging, which is a special case. In the case of accelerated imaging using SENSE, the alias ghosts are caused by the k-space sampling function (intentional undersampling), whereas in this formulation the distortion arises from continuous amplitude or phase errors, including space variant distortion.

Application to Ghost Artifacts in EPI

Ghosts artifacts result from periodic phase and amplitude errors between lines of k-space (echoes). In applications such as echo-planar imaging (EPI), widely used for ultra-fast imaging, examples of errors that cause ghost artifacts include EPI phase or delay misalignment and phase errors due to motion or flow. In general, ghost artifacts are a spatial variant distortion since the values depend on local effects such as flow or off-resonance due to chemical shift or susceptibility variation. A number of techniques are used to minimize distortion and ghost artifacts. The phased array processing method for ghost cancellation adds yet another tool, which may be incorporated to further mitigate EPI distortion and artifacts.

Application to multi-shot EPI with both interleaved and non-interleaved phase encode acquisition order is considered for cardiac imaging. In applications such as in cardiac imaging where the $T_2^*$ value is relatively short, images are typically acquired using multiple shots with relatively short echo-trains. To avoid ghost artifacts, images are frequently acquired using an interleaved phase encode order, although interleaved phase encode order has several drawbacks. Drawbacks of this approach are the geometric and intensity distortion caused by off-resonance phase errors due to chemical shift or susceptibility variation, distortion due to in-plane flow, increased echo train length which results when echo shifting is employed, and distortion due to echo delay misalignment. Using a non-interleaved phase encode order with an echo train length, ETL, will cause $N_g$=ETL-1 ghosts spaced D=FOV/ETL, and, therefore, has not been considered viable. A non-interleaved phase encode acquisition order has benefits if the ghosts may be eliminated. Cancellation of ghosts by means of phased array processing makes non-interleaved strategies possible. In this case, the drawbacks cited above for interleaved acquisition are traded for widely spaced ghosts, which in turn are cancelled by phased array processing. In addition, the time ordering of shots may be designed to optimize the k-space weighting due to T1-recovery for applications such as contrast enhanced imaging.

In the case of non-interleaved acquisition, pixels with an off-resonance frequency of $\Delta f$ lead to a periodic k-space (phase) weighting, with period ETL $\Delta k_y$, where $\Delta k_y$ is the spacing between phase encode lines. The complex k-space weights (ignoring a constant phase factor), due to off-resonance at a pixel (x,y), are $H_m(x,y)=e^{j[m\Delta\phi]}$, where $\Delta\phi=2\pi\Delta f(x,y) \Delta TE$, $\Delta TE$ is the echo spacing, m=0, . . . , ETL-1 is an integer index corresponding to $k_y$=m$\Delta k_y$, repeating with period ETL $\Delta k_y$. The corresponding values of the discrete point spread function $h_m(x,y)$ (space variant) are derived from the ($N_g$+1)-point discrete Fourier transform, i.e., $h_m(x,y)$=DFT$\{H_m(x,y)\}$.

Output Combining

The desired image $f(x,y)$ can be estimated from the solution vector $\hat{f}$ defined by Eq. [5]. In the case where the point spread function h(x,y) is known, or can be estimated adaptively, the signal-to-noise ratio of the estimate $\hat{f}(x,y)$ of $f(x,y)$ is maximized by matched filtering:

$$\hat{f}(x,y)=h(x,y)^H \cdot \hat{f}(x,y) \qquad [6]$$

The estimate of the image is weighted by the squared norm $\|h\|^2$=$h^H \cdot h$, which in many cases is approximately constant. If instead, the matched filter coefficient vector is first normalized to have unity norm (i.e., h/$\|h\|$), then the resultant image is weighted by $\|h\|$. Alternatively, in cases where h is unknown, the image magnitude may be estimated non-coherently as the square root of the sum of the squares:

$$\hat{f}(x,y)=\sqrt{\hat{f}(x,y)^H \hat{f}}(x,y) \qquad [7]$$

The matched filter coefficients may be estimated from the images themselves. In situations where multiple images are acquired, smoothing may be employed to reduce the error due to noise. For this case, one method which estimates the normalized coefficients (within a constant phase offset), is to form the time averaged (or temporally low-pass filtered) sample covariance matrix for each pixel, $$R(x, y) = \sum_t \hat{f}(x, y, t)\hat{f}^H(x, y, t), \qquad [8]$$

where the variable t represents a time index, and averaging is performed over a number of frames during which h(x,y,t) has small time variation. An estimate of h(x,y)/$\|h(x,y)\|$ may be obtained by using the eigenvector of R(x,y) with maximum eigenvalue. The relative phase between components is preserved. For phase sensitive reconstruction, the same matched filter coefficients must be applied to the reference and desired images.

The inverse solution (Eq. [4]) amplifies the noise causing a loss in signal-to-noise ratio (SNR) which is spatially varying. The loss in SNR relative to the artifact free image, i.e., h(x,y)=$\delta$(x,y) (discrete delta function), is calculated as:

$$SNR_{loss} = \frac{1}{\sqrt{(S^H R_n^{-1} S)^{-1}_{(1,1)}(S^H R_n^{-1} S)_{(1,1)}}}, \qquad [9]$$

where the subscript (1,1) denotes the index of the matrix (first diagonal element). The spatially varying denominator of Eq. [9] is also referred to as the geometry factor G. This is derived by noting that the SNR loss of each component of the properly aligned image vector $\hat{f}$ relative to the SNR of $h_k(x,y)f(x,y)$ is given as $SNR_{loss}$ (Eq. [9]). The individual noise components of the vector $\hat{f}(x,y)$ are independent since the full FOV acquisition results in spatially white noise over the full field of view. Thus the net loss in SNR for the final matched filter estimate $\hat{f}(x,y)$ (Eq. [6]) relative to the SNR of $f(x,y)$ is simply $SNR_{loss}$ (Eq.[9]).

SUMMARY

In sum, the described method reconstructs intermediate images for each ghost, weighted by the complex space variant point spread function, which may be combined to produce a final image with ghosts artifacts cancelled. The intermediate ghost images may be combined in a coherent manner using complex weights derived from estimates of the point spread function. Coherent combining preserves phase and, therefore, permits partial-Fourier homodyne demodulation or more general phase sensitive image reconstruction.

Application of this phased array ghost cancellation method to non-interleaved multi-shot EPI ghosts was described in detail. This method is also applicable to k-space acquisition with other phase encode ordering including time varying phase encode orders. Incorporating this phased array method for ghost cancellation may result in greater flexibility in designing acquisition strategies. Cancellation of ghosts by means of phased array processing makes using phase encode orders that have periodic k-space distortion practical, and in fact has a number of benefits. For example, there is a reduction in repetition time, TR, by eliminating the need for echo-shifting. Other benefits include a reduced distortion due to off-resonance, in-plane flow, and EPI delay misalignment. The reduction in EPI blip size is also a great benefit in reducing through plane flow distortion. This method might also be desirable in contrast enhanced imaging, in order to optimize the k-space weighting due to $T_1$ recovery by proper time ordering of shots. This technique is applicable to cancellation of ghosts arising from other mechanisms such as motion during cine imaging even with single echo.

In theory, the general formulation presented shows that phased array processing may be used for quite general distortion including local blurring, however, the ability to use this method to improve spatial resolution places demands on the coil sensitivity profile to have high spatial variation.

Having illustrated and described the principles of the illustrated embodiments, it will be apparent to those skilled in the art that the embodiments can be modified in arrangement and detail without departing from such principles. For example, the order of linear operators are commutative and may be rearranged. The order of the phased array combiner and output combiner may be reversed. In this case the output combiner would sum weighted values of shifted images for each coil prior to a single phased array combiner.

For example, the described techniques can be applied irrespective of the location (spacing) of ghost artifacts. The shifters simply need to be adjusted accordingly. Additionally, the illustrated techniques can be applied to space variant or space invariant ghost artifacts.

The above description may also be used in conjunction with other phase encode schemes, such as partial-NEX (where NEX is the number of excitations or k-space lines). In the case of partial-NEX, a fraction of k-space is skipped (for instance the 1st 25%). Additionally, the above description can use phase sensitive reconstruction.

Still further, the different elements embodying the invention can be performed in hardware, software, or a combination thereof.

In view of the many possible embodiments to which the principles of our invention may be applied, it should be recognized that the illustrated embodiment is only a preferred example of the invention and should not be taken as a limitation on the scope of the invention. Rather, the scope of the invention is defined by the following claims. We therefore claim as our invention all that comes within the scope of these claims.

We claim:

1. A method of canceling ghost artifacts in magnetic resonance imaging to produce an image or series of images) comprising:
   acquiring data using an array of receiver coils in a magnetic resonance environment, wherein the data is acquired using a phase encode order in which k-space distortion has components which are substantially periodic;
   converting the data to the image domain to produce images with ghost artifacts; and
   canceling the ghost artifacts using phased array ghost cancellation processing to produce an image or series of images with ghost artifacts removed.

2. The method of claim 1, wherein the acquired data is k-space data.

3. The method of claim 1, wherein the converting comprises using a fast Fourier transform.

4. The method of claim 1, wherein the phase encode order is designed such that the k-space distortion has a rapid periodic variation, thereby trading what would be an image blurring for image ghosts which can then be canceled by the phased array ghost cancellation processing.

5. The method of claim 1, wherein the phased array ghost cancellation processing includes passing the images with the ghost artifacts through two or more phased array combiners coupled in parallel.

6. The method of claim 5, further including aligning separated ghost images by shifting at least one image either prior to phased array combining or following phased array combining.

7. The method of claim 5, wherein the phased array combiners receive an image for each receiver coil and combine the images from the receiver coils into a single image.

8. The method of claim 5, further including combining each of the single images received from the phased array combiners into a final output image.

9. The method of claim 5, further including combining outputs of the two or more phased array combiners using an output combiner and adaptively computing the output combiner's coefficients as the output combiner is outputting the series of images.

10. The method of claim 1, wherein using phased array ghost cancellation processing includes using a plurality of phased array combiners coupled in parallel and the method further includes adaptively calculating phased array combiner complex coefficients.

11. The method of claim 1, further including using a phase encode order that is varied in time to achieve periodic distortion which is time varying in a manner that enables calculating a lower time resolution image without ghost artifacts.

12. The method of claim 11, wherein a ghost suppressed image is obtained for the purpose of adaptively calculating phased array combiner coefficients for ghost cancellation.

13. The method of claim 1, further including temporally filtering to further suppress ghost artifacts.

14. The method of claim 1, wherein canceling comprises a constrained optimization that optimizes signal-to-noise ratio subject to the constraint of nulling a ghost artifacts at a known location.

15. The method of claim 1, wherein the data is acquired based on multi-shot echo planar imaging with non-interleaved phase encode acquisition.

16. A system for canceling ghost artifacts in magnetic resonance imaging to produce an image or a series of images, comprising:
an image reconstructer that receives k-space data and converts the k-space data to the image domain;
a plurality of array combiners coupled to the image reconstructer, the array combiners being coupled in parallel;
at least one shifter coupled in series between one of the array combiners and the image reconstructer; and
an output combiner coupled to each of the array combiners that provides the series of images.

17. The system of claim 16, further including a processor for adaptively calculating array coefficients for the array combiners.

18. The system of claim 16, further including a processor for adaptively calculating combiner coefficients for the output combiner.

19. The system of claim 16, further including multiple coils placed near a target to be imaged that receive k-space data representative of the target in the frequency domain and pass the data to the image reconstructer.

20. The system of claim 16, wherein the at least one shifter includes a first shifter and further including at least a second shifter coupled in series with an array combiner, the second shifter coupled in parallel with the first shifter.

21. The system of claim 16, wherein the at least one shifter includes $N_G-1$ shifters coupled in parallel, where $N_G$ is a number of ghost artifacts in images produced by the image reconstructer, each shifter coupled between one of the array combiners and the image reconstructer.

22. The system of claim 16, wherein the array combiners combine images on a pixel-by-pixel basis and wherein the pixels have a complex weighting.

23. The system of claim 16, wherein the output combiner is a coherent combiner and wherein the pixels of the images being combined have a complex weighting associated therewith.

24. The system of claim 16, wherein the array combiners produce a weighted image $h_i(x,y)f(x,y)$, where i is an integer number associated with the array combiner, $h_i(x,y)$ is a space-variant point spread function and $f(x,y)$ is a desired image.

25. The system of claim 16, further including a temporal filter coupled in series with at least one of the array combiners to further suppress ghost artifacts.

26. The system of claim 16, wherein the phase encode order is a non-interleaved phase encode order with an echo train length ETL, and the known fixed spacing is equal to FOV/ETL, wherein FOV is a field of view.

27. A system for canceling ghost artifacts in magnetic resonance imaging to produce a series of images, comprising:
means for acquiring data using an array of receiver coils in a magnetic resonance environment, wherein the data is acquired using a phase encode order which causes k-space distortion to be periodic with a period corresponding to widely spaced ghost artifacts;
means for converting the data to the image domain to produce images which have ghost artifacts; and
means for canceling the ghost artifacts using phased array ghost cancellation processing to produce a series of images with ghost artifacts removed.

28. The system of claim 27, further including temporal filtering means coupled in series with the phased array ghost cancellation processing to further suppress ghost artifacts.

29. A method of canceling ghost artifacts in magnetic resonance imaging to produce an image or series of images, comprising:
acquiring data using an array of receiver coils in a magnetic resonance environment, wherein the data is acquired using a phase encode order in which k-space distortion has components which are substantially periodic;
converting the data to the image domain to produce images with ghost artifacts; and
canceling the ghost artifacts using at least one phased array combiner that receives the image domain data and produces an image or series of images with ghost artifacts removed.

30. The method of claim 29, further including a temporal filter coupled in series with the at least one phased array combiner to further suppress ghost artifacts.

31. The method of claim 30, further including adaptively calculating coefficients for the phased array combiner.

32. The method of claim 29, wherein the data is acquired using a time-varying phase encode order.

* * * * *

UNITED STATES PATENT AND TRADEMARK OFFICE
CERTIFICATE OF CORRECTION

PATENT NO. : 6,771,067 B2
APPLICATION NO. : 09/825617
DATED : August 3, 2004
INVENTOR(S) : Kellman and McVeigh It is certified that error appears in the above-identified patent and that said Letters Patent is hereby corrected as shown below:

In Other Publications:

Page 2, Madore et al., "813-2" should be --813-28--.

Page 2, Xin Wan et al., "maging" should be --Imaging--.

Page 2, Oppelt et al., "Barfuß," should be --Barfuss--.

In the Specification:

Column 3, line 2, "cause" should be --caused--.

Column 5, line 10, "coils" should be --coil'--.

Column 5, line 16, "order makes" should be --order that makes--.

Column 6, line 50, "ghosts" should be --ghost'--.

Column 7, line 6, "may desirable" should be --may be desirable--.

Column 8, lines 56-57, "This is may be" should be --This may be--.

Column 10, line 20, "g(x,y)=S(x,y)f(x,y)+n(x,y) y)" should be $$-- g(x, y) = S(x, y)\ \tilde{f}(x, y) + n(x, y) --.$$

Column 10, lines 64-65, "are the simply the" should be --are simply the--.

Column 13, line 8, "ghosts artifacts" should be --ghost artifacts--.

In the Claims:

Column 14, line 8, "images) comprising" should be --images comprising--.

Column 14, line 66, "a ghost artifacts" should be --ghost artifacts--.

Signed and Sealed this

Fifteenth Day of August, 2006

JON W. DUDAS
*Director of the United States Patent and Trademark Office*